United States Patent
Kusaka et al.

(10) Patent No.: US 6,761,814 B2
(45) Date of Patent: Jul. 13, 2004

(54) VIA FILLING METHOD

(75) Inventors: Masaru Kusaka, Saitama (JP); Hideki Tsuchida, Hasuda (JP)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/327,588

(22) Filed: Dec. 20, 2002

(65) Prior Publication Data

US 2003/0183526 A1 Oct. 2, 2003

(30) Foreign Application Priority Data

Dec. 20, 2001 (JP) .......................................... 2001-388120

(51) Int. Cl.$^7$ .............................. C25D 5/02; C25D 5/18
(52) U.S. Cl. ........................ 205/118; 205/103; 205/123; 205/125
(58) Field of Search ................................ 205/103, 125, 205/123, 118

(56) References Cited

U.S. PATENT DOCUMENTS 4,396,467 A * 8/1983 Anthony ...................... 205/103
6,402,924 B1 * 6/2002 Martin et al. ............... 205/103

FOREIGN PATENT DOCUMENTS

JP                63-177586              7/1988

* cited by examiner

*Primary Examiner*—Edna Wong
(74) *Attorney, Agent, or Firm*—S. Matthew Cairns (57) ABSTRACT

A via filling method that provides superior filling properties and superior planarization of the deposited metal layer is provided. This is achieved by a method having a F/R ratio, the ratio of the electric current densities between the forward electrolysis and the reverse electrolysis, is in the range of 1/1 to 1/10 in a PPR electric current method applied with a cycle wherein the forward electrolysis interval is from 1 to 50 msec and the reverse electrolysis interval is from 0.2 to 5 msec.

9 Claims, 4 Drawing Sheets

VIA FILLING METHOD

BACKGROUND OF THE INVENTION

The present invention relates to a method of via filling. More specifically, it relates to a via filling method that provides superior filling properties and superior planarization as compared to conventional methods.

There have been strong demands in recent years for thinner printed wiring boards with higher interconnect densities compatible with improved functionality and miniaturization of electronic equipment such as personal computers. One method by which to respond to these demands has been to use multilayer printed wiring boards ("build-up" printed wiring boards) that are manufactured using a build-up process technology wherein each individual layer is patterned as it is layered on the printed wiring board.

In recent years, a method known as "via filling" has been developed wherein micro via holes (hereinafter termed "MVHs" in some cases) are entirely filled with conductive material to provide electrical conductivity between adjacent layers of a build-up printed wiring board. Such via filling makes it possible to increase the effective area of printed wiring boards by obtaining adequate electrical conductivity using MVHs with smaller diameters than those that can be used with the conventional method of plating only the inner wall surfaces of the MVHs. This method effectively reduces the size of the printed wiring boards and increases the density thereof.

Various via filling methods have been described, including a method where the MVHs are filled with electrically conductive paste using a printing method, a method where only the conductive layer at the bottom of the MVH is activated and non-electrolytic plating is layered selectively thereon, and a method where electrolytic plating is performed.

However, the conductivity of conductive pastes is low compared to pure metal because the pastes are mixtures of metal and organic materials, making it difficult to achieve adequate electrical conductivity in small-diameter MVHs. Thus, the electrically conductive paste cannot be said to be an effective way to miniaturize, and increase the density of, printed wiring boards. In addition, filling that is done using a printing method requires viscous paste to be filled into small diameter holes that are closed on one end; however, because the paste is viscous, it is difficult to fill the entire hole without leaving voids. While the method that uses non-electrolytic plating is superior to the electrically conductive paste method in that the MVH fill material is a high-conductivity metal deposit, the speed at which the plating layer is deposited is slow, causing problems with productivity. For example, when a typical high-speed non-electrolytic copper plating solution is used, the deposition rate of the plating film is about 3 microns per hour. When such method is used to fill with copper plating a typical blind via hole (termed "BVH" in some cases below) with a diameter of 100 μm and a depth of 100 μm, the productivity is extremely bad, with the process taking more than 30 hours.

Because electrolytic plating can reduce the plating time substantially when compared to non-electrolytic plating, there have been high hopes for the application of electrolytic plating to MVHs. However, when metal is deposited on all surfaces within the MVH, the deposition rate in the vicinity of the bottom surface inside the MVH must be faster than the deposition rate near the opening if the inside of the MVH is to be filled with metal without leaving voids. When the deposition rate near the bottom surface is the same as or slower than the deposition rate at the opening, the MVH either will not be filled, or the opening part of the MVH will become blocked before the inside of the MVH is completely filled with metal, causing voids inside the MVH, with results being inadequate for practical use in either case. Consequently, successfully filling the micro via holes requires strict control of the filling parameters so as to be able to deposit the metal appropriately.

Conventionally, a direct current typically has been used in the electrolysis when using an electrolytic plating solution to expedite the deposition rate in the vicinity of the bottom surface of the MVH. While a method where PR (periodic reverse) electrolysis, wherein the anode and cathode are alternated, is already known, the cycle time has been extremely long, ranging from several seconds to several tens of seconds, so the metal deposition rate has not been satisfactorily slow.

Furthermore, the surface that has been filled has not been flat, but rather the center of the via has had a dimpled shape. Because of this, when the filling was extended to an adequate height, the plating on the parts outside of the via holes would be thicker, which was undesirable not only because this caused a host of problems in subsequent processing, but also undesirable from an economic perspective.

Unexamined Japanese Patent Application Publication 2000-68651 discloses a method for performing electrolytic plating using a PPR (Pulse Period Reverse) electric current and a solution containing specific compounds containing sulfur atoms. The invention disclosed in this Application controlled the deposition and removal of a specific sulfur-containing compound to and from a substrate through the use of a PPR current; however, successful filling high-aspect-ratio micro via holes would require even more stringent control of the plating conditions.

SUMMARY OF THE INVENTION

The present invention is the result of reflection on the facts described above, and its object is to provide a novel filling method that provides superior filling properties in a short period of time while providing a surface with superior planarization.

The present invention provides a via filling method wherein a PPR electric current is applied with a cycle having a forward electrolysis interval of 1 to 50 msec and a reverse electrolysis interval of 0.2 to 5 msec, with an F/R ratio in the range of 1/1 to 1/10. The F/R ratio is the ratio of the forward electrolysis current density to the reverse electrolysis current density. Accordingly, the present invention provides a method of filling vias on a substrate comprising contacting the substrate with a metal electroplating bath and applying sufficient current density to deposit a desired metal layer, wherein the current density is applied in a cycle of a forward current density (F) for 1 to 50 msec, and a reverse current density (R) for 0.2 to 5 msec, where a ratio of F/R is from 1/1 to 1/10.

Also provided by the present invention is a method of filling vias on a substrate comprising contacting the substrate with a metal electroplating bath and applying sufficient current density to deposit a desired metal layer, wherein the current density is applied in a first cycle of a first forward current density (F1) for 1 to 50 msec and a first reverse current density (R1) for 0.2 to 5 msec, where a ratio of F/R is from 1/1 to 1/10, and a second cycle of a second forward current density (F2) for 1 to 50 msec and a second reverse current density (R2) for 0.2 to 5 msec where a ratio of F2/R2 is from 1/1 to 1/0.1, where the second reverse current density is less than the first reverse current density.

DETAILED DESCRIPTION OF THE INVENTION

The forward electrolysis interval refers to the interval wherein electrolysis is performed with the item to be plated acting as the cathode, and the reverse electrolysis interval refers to the interval wherein electrolysis is performed with the item to be plated acting as the anode. Although the forward electrolysis interval and the reverse electrolysis interval will vary depending on the plating conditions, the diameter and aspect ratio of the MVHs to be filled, the type of metal used as the filling, and the like, the conditions, typically, are as described below. The forward electrolysis interval is 1 to 50 msec, preferably between 5 and 30 msec, and more preferably between 10 and 20 msec. The reverse electrolysis interval is between 0.2 to 5 msec, preferably between 0.2 and 2 msec, and more preferably between 0.2 and 1 msec.

While forward electrolysis of less than 1 msec may be used, it is undesirable because the electrolysis would terminate prior to the commencement of normal metal deposition. While a forward electrolysis interval longer than 50 msec may be used, but the absorption of any grain refiner used may increase in the vicinity of the opening of the blind via hole, making it impossible for the deposition rate of the metal plating in the vicinity of the bottom of the blind via hole to be faster than the rate of deposition in the bottom part, and thus making it difficult to obtain a good filling. A reverse electrolysis interval shorter than 0.2 msec may be used, but the adhesion of any grain refiner in the vicinity of the opening of the blind via hole will increase. Such increase in grain refiner adhesion makes it difficult for the deposition rate of the metal plating layer in the vicinity of the bottom of the blind via hole to be faster than the deposition rate at the opening, and thus making it difficult to obtain a good filling. On the other hand, if the reverse electrolysis interval is longer than 5 msec, the metal plating layer that has been deposited will be dissolved, which would be undesirable because it would increase the time that is required for filling the blank via hole.

The forward electrolysis is, preferably, performed with an electric current density from 0.1 to 20 A/dm$^2$, and more preferably from 0.1 to 10 A/dm$^2$. The reverse electrolysis is performed, preferably, at a current density from 0.1 to 200 A/dm$^2$ and more preferably, from 0.1 to 100 A/dm$^2$.

As used herein, the ratio of the forward electrolysis electric current density to the reverse electrolysis electric current density is termed the "F/R ratio." In other words, the value of the reverse electrolysis electric current density R when the value of the forward electrolysis current density F is 1 is called the F/R ratio, and is smaller when F/R=1/1 than when F/R=1/2. The F/R ratio is preferably from 1/1 to 1/10, and more preferably from 1/1 to 1/5, and most preferably from 1/1 to 1/3.

When F/R is less than 1 it may be difficult to adequately remove the grain refiner that adheres in the vicinity of the opening of the blind via hole, and thus the rate of deposition of the metal plating layer in the vicinity of the bottom of the blind via hole cannot be any faster than the rate of deposition at the opening part, making it difficult to obtain a good filling.

The present invention also provides a via filling method wherein a PPR current with a forward electrolysis interval of from 1 to 50 msec and a reverse electrolysis interval from 0.2 to 5 msec is also applied, wherein there is a first process that performs via filling with an F/R ratio from 1/1 to 1/10, and a second process the performs via filling with an F/R ratio from 1/1 to 1/0.1, where the F/R ratio in the second process is less than the F/R ratio in the first process, i.e., the reverse current density used in the second process is less than the reverse current density used in the first process. By performing the aforementioned second process, it becomes possible to obtain a via filling effect wherein the surface around the via parts is flat.

In the second process, the F/R ratio is from 1/1 to 1/0.1, and the F/R ratio in the second process must be less than the F/R ratio in the first process. Although in the first process the filling in the inside of the blind via hole is substantially expedited, the planarization of the surface when the filling is complete may be inadequate, in certain cases producing a surface where there is a dimple in the middle of the via. In such cases, it is desirable to perform the plating of the second process, with a smaller F/R ratio when the filling is nearly complete. Reducing the F/R ratio changes the effect of the additive material, which is thought to make it possible to obtain a flat surface because it reduces the effect that suppresses the deposition at the high current parts. In the second process, the F/R ratio should, preferably, be from 1/1 to 1/0.2, and more preferably from 1/1 to 1/0.5.

In the present invention, electrical conductivity is ensured through the use of a flash plating process to deposit a metal layer on the inside walls of the via hole prior to performing the via filling process using PPR electrolysis.

This flash plating can be performed using a direct-current electrolysis method, a pulsed electrolysis method, or a PPR electrolysis method. In other words, the present invention is also provided in the following three forms:

i) A method wherein the via filling method of the present invention is performed after performing flash plating using direct-current electrolysis;

ii) A method wherein the via filling of the present invention is performed after performing a flash plating using pulsed electrolysis; and iii) A process wherein the via filling of the present invention is performed after performing flash plating using PPR electrolysis.

The via filling method of the present invention, as described above, includes the case wherein only the first process, alone, is performed, and the case where both the first process and the second process are performed. Consequently, if, for the sake of convenience, the first process in the present invention is termed the "filling process," and the second process is termed the "planarization process," the present invention contains the following eight types of methods:

1) A method wherein the filling process is performed alone.
2) A method wherein the filling process and the planarization process are performed.

3) A method wherein the direct-current electrolysis flash plating and the filling process are performed.
4) A method wherein the pulsed current electrolysis flash plating and the filling process are performed.
5) A method wherein the PPR electrolysis flash plating and the filling process are performed.
6) A method wherein the direct-current electrolysis flash plating, the filling process, and the planarization process are performed.
7) A method wherein the pulsed current electrolysis flash plating, the filling process, and the planarization process are performed.
8) A method wherein the PPR electrolysis flash plating, the filling process, and the planarization process are performed.

Direct-current electrolysis refers to electrolysis that uses a direct-current power source. The electric currents, time intervals, and other electrolysis conditions, along with the compositions of the plating solutions, are well known, and can be selected as appropriate by one skilled in the art.

Pulsed electrolysis refers to electrolytic plating that is performed using a pulsed power supply, or in other words, using electrolysis conditions wherein the power supply is pulsed between a forward electrolysis interval and a paused interval. The electric currents, time intervals, and other electrolysis conditions, along with the compositions of the plating solutions, are well known, and can be selected as appropriate by one skilled in the art.

PPR electrolysis for flash plating is typically performed by applying a forward electrolysis interval of from 1 to 50 msec and a reverse electrolysis interval of from 0.2 to 5 msec, although other intervals may be used advantageously. Such PPR electrolysis for flash plating is typically performed at an F/R ratio of from 1/1 to 1/0.1, which is less than the F/R ratio in the filling process.

Whichever method is selected, the flash plating is performed until adequate conductivity is obtained, depositing metal over the entire sidewalls of the via holes. The metal layer thickness when the flash plating is completed is typically up to 5 $\mu$m, and preferably from 0.5 to 5 $\mu$m.

Note that the method wherein PPR electrolysis is used is preferable when the aspect ratio of the via hole is large; this is because the PPR electrolysis provides better surface conformance properties. While direct-current electrolysis method requires two plating tanks because the composition of the plating solution for direct-current electrolysis is generally different from the composition of the plating solution for PPR electrolysis, the PPR electrolysis method can be done with a single plating tank. Such single tank makes it possible to perform all of the processes by simply changing the electrolysis conditions, which is not only convenient in terms of operations, but also beneficial in terms of economics. However, depending on the composition of the solution, it is also possible to perform both the direct-current electrolysis and the PPR electrolysis in the same plating tank.

A pause time interval should be provided in the PPR electrolysis in the present invention. That is to say, in the present invention, the PPR current can be applied in a cycle with a forward electrolysis interval of from 1 to 50 msec, a reverse electrolysis interval of from 0.2 to 5 msec, and a pause interval of from 0.1 to 20 msec. The pause interval is preferably from 0.5 to 5 msec, and more preferably from 0.5 to 1 msec. The pause interval can be used in all the PPR electrolysis processes. In other words, in the PPR electrolysis used in the first process, the second process, and/or the flash plating process in the via filling method of the present invention.

In the present invention, the pause interval refers to a time interval wherein electrolysis is not performed. The pause interval can be provided either in the transition from the forward electrolysis to the reverse electrolysis, or in the transition between the reverse electrolysis to forward electrolysis, or can be provided in both. Preferably, the pause interval is provided in the transition between the reverse electrolysis to the forward electrolysis. The provision of this type of pause interval is thought to provide a better filling result because it allows time the supply of the metal ions, required for plating, into the via holes.

The method of this invention can be useful for filling metal inside of indentations that have high aspect ratios such as via holes. Using the method of the present invention, it is possible to fill indentations with diameters of less than 100 $\mu$m with aspect ratios greater than 1, typically greater than 3, and, in particular, greater than 5.

Any metals which can be electrolytically plated may be used in the present method. Suitable metals include, without limitation, copper, nickel, gold, silver, palladium, tin, lead, platinum, chrome, zinc, cadmium, iron, aluminum, and alloys thereof, such as solder.

By way of example, the present method will be described using copper as the metal. However, this is merely used as an example, and does not limit the scope of the invention in any way. Additionally, the grain refiners and surfactants, described below, are those that are particularly well suited to copper sulfate plating baths. However, the use of other compounds that provide similar effects in plating with other types of metals is well known, and the effects of the present invention can be obtained similarly in systems including those types of compounds.

When the present invention is used to fill blind via holes with copper, a copper sulfate plating solution is typically used. Such copper plating solution preferably contains a grain refiner. Grain refiners are positively charged substances in the plating solution, where the grain refiners adhere to the surface of the object to be plated during the electrolysis, and detach from the surface of the object to be plated during the reverse electrolysis. When adhered to the surface of the object to be plated, these substances have an effect that facilitates the growth of the metal layer.

Typically, grain refiners are compounds that contain the structure —S—CH$_2$O—R—SO$_3$M as a group, or, compounds that contain the structure —S—R—SO$_3$M as a group, wherein M is either hydrogen or an alkali metal, and R is an alkyl group containing three to eight carbon atoms. Compounds containing the structures in formulae (1) to (6), below, are typical grain refiners, although other suitable grain refiners may be used.

(1) M—SO$_3$—(CH$_2$)$_a$—S—(CH$_2$)$_b$—SO$_3$—M;
(2) M—SO$_3$—(CH$_2$)$_a$—O—CH$_2$—S—CH$_2$—O—(CH$_2$)$_b$—SO$_3$—M;
(3) M—SO$_3$—(CH$_2$)$_a$—S—S—(CH$_2$)$_b$—SO$_3$—M;
(4) M—SO$_3$—(CH$_2$)$_a$—O—CH$_2$—S—S—CH$_2$—O—(CH$_2$)$_b$—SO$_3$—M;
(5) M—SO$_3$—(CH$_2$)$_a$—S—C(=S)—S—(CH$_2$)$_b$—SO$_3$—M;
(6) M—SO$_3$—(CH$_2$)$_a$—CH$_2$—S—C(=S)—S—CH$_2$—O—(CH$_2$)$_b$—SO$_3$—M.

In formulae (1) through (6), above, a and b are integers from 3 to 8, and M is a hydrogen or an alkali metal.

Grain refiners are typically called "brighteners," and are used to improve the appearance of the plated layers. However, such compounds may be used for other purposes, but are still included in the term "grain refiners" as used herein as long as they provide the same effect. When a grain refiner is used, it may be used alone or a mixture of grain refiners may be used. The grain refiner is typically used in an amount of 0.1 to 100 mg/L, or, preferably, from 0.5 to 10 mg/L. When the grain refiner is used for purposes other than that of improving the appearance of the plated layer, the appropriate range for the amount used can be determined as appropriate by one skilled in the art.

When the present PPR electrolysis method is used, the grain refiner is caused by the electrolysis to adhere to the inside walls of the blind via holes to be coated, and then, during the short reverse electrolysis intervals, only those grain-refiners in the vicinity of the blind via hole openings, wherein the electric current tends to accumulate, become detached. Consequently, by repeating the reversals of the direction of the electric current, the amount of the grain refiner adhered in the vicinity of the bottom of the blind via holes is increased while the amount of the grain refiner adhered in the vicinity of the openings of the holes is decreased. As a result, the effect of the grain refiner facilitating the growth of the metal layer operates more strongly near the bottom of the blind via hole so that the rate of deposition of the metal layer in the vicinity of the bottom of the blind via hole is faster than the rate of deposition at the opening. This makes it possible to fill the blind via hole with metal deposits without any gaps or voids in the metal deposit.

Typically, the electrolytic metal plating solution, particularly an electrolytic copper plating solution, includes a surfactant that functions as a wetting agent in the plating solution. Any conventional surfactant can be used as an additive to the electrolytic metal plating solution. For copper plating solutions, the surfactant is preferably a polyether that includes at least five, and preferably 20, ether oxide linkages. Although compounds having the structures in formulae (7) through (9), below, are examples of this type of surfactant, the surfactants are not limited thereto:

(7) $HO-(CH_2-CH_2-O)_a-H$ (where a is an integer of 5 to 500);

(8) $HO-(CH_2-CH(CH_3)-O)_a-H$ (where a is an integer between 5 and 200); and (9) $HO-(CH_2-CH_2-O)_a-(CH_2-CH(CH_3)-O)_b-(CH_2-CH_2-O)_c-H$ (where a and c are integers such that a+c is 5 to 250, and b is an integer of 1 to 100).

The surfactant used in the present invention can be either a single surfactant, or a mixture of two or more surfactants. The surfactant used in the metal plating baths is typically used in an amount of 0.05 to 10 g/L, and preferably from 0.1 to 5 g/L. If an insufficient amount of surfactant is used a large number of pinholes may occur in the deposit due to an inadequate wetting effect.

When a copper sulfate plating solution is used, such solution is a water-soluble solution containing sulfuric acid, copper sulfate, and water-soluble source of chloride ions as the basic composition. Any conventional copper sulfate plating solution may be used.

The sulfuric acid concentration in the copper sulfate plating solution is typically from 39 to 400 g/L, and is preferably from 170 to 210 g/L. Other suitable amounts of sulfuric acid may be used.

The concentration of the copper sulfate in the copper sulfate plating solution is typically from 20 to 250 g/L, and preferably is from 60 to 180 g/L. If the copper sulfate concentration is too low, there will be an inadequate supply of copper ions to the substrate to be plated, making it difficult to deposit the desired copper layer. Additionally, if the copper sulfate concentration is too high, it will be difficult to dissolve all of the copper sulfate.

Any water-soluble source of chloride ions may be used. Hydrochloric acid, sodium chloride, potassium chloride, ammonium chloride, and the like are examples of suitable water-soluble sources of chloride ions. Such chloride ion sources may be used alone or as a mixture. The concentration of the water-soluble chloride ion source, in terms of the concentration of the chloride ions, is typically from 10 to 200 mg/L, and preferably, from 30 to 80 mg/L.

A wide variety of substrates may be plated using the present via filling method, provided they are robust to the conditions of the via filling method, and insofar as they support the fabrication of a plated metal layer. Such substrates may be composed of any suitable material and may have any suitable shape. Resin, ceramic, metal, and so forth, may be listed as possible materials, but the present invention is not limited thereto. For example, substrates for printed wiring boards and semiconductor wafers such as silicon wafers can be used with good results. Substrates that have through holes, via holes, or the like are preferred substrates to be provided in the present invention, and, more preferably, printed wiring boards and substrates with through holes and/or via holes can be used.

The resins used in the substrates may include, but are not limited to, high-density polyethylene, medium-density polyethylene, branched low-density polyethylene, straight low-density polyethylene, ultrahigh-molecular weight polyethylene, and other polyethylene resins, polypropylene resins, polybutylene resins, polystryene resins and other polyolefin resins, polyvinyl chloride resins, polyvinylidene chloride resins, polyvinylidene chloride-vinyl chloride copolymer resins, chlorinated polyethylene, chlorinated polypropylene, tetrafluoroethylene, and other halogen-containing resins, AS resin, ABS resin, MBS resin, polyvinyl alcohol resin, polymethyl acrylate and other polyester acrylate resins, meta-methyl acrylate methyl-styrene copolymer resins, maleic anhydride-stryene copolymer resins, polyvinyl acetate resins, polycellulose propionate and resin, cellulose acetate, and other cellulose resins, epoxy resins, polyimide resins, nylon and other polyamide resins, polyamideimide resins, polyallylate resins, polyethylamide resins, polyethyl ethyl ketone resins, polyethylene oxide resins, PET and other types of polyester resins, polycarbonate resins, polysulfone resins, polyvinyl ethyl resins, polyvinyl butyral resins, polyphenylene oxides and other polyphenylene ether resins, polyphenylene sulfide resins, polybutylene terephthalate resins, polymethyl pentane resins, vinyl chloride-vinyl acetate copolymers, ethylene vinyl acetate copolymers, ethylene vinyl chloride copolymers, or the like, in addition to copolymers and blends of the above other thermoplastic resins, epoxy resins, xylene resins, guanamine resins, diallyl phthalate resins, vinyl ester resins, phenol resins, unsaturated polyester resins, furan resins, polyimide resins, polyurethane resins, maleic acid resins, melamine resins, urea resins, and other thermo hardening resins, along with mixtures of the above. Preferred resins include epoxy resins, polyimide resins, vinyl resins, phenyl resins, nylon resins, polyphenylene ester resins, polypropylene resins, fluorine resins and ABS resins, where, more preferably, there are epoxy resins, polyimide resins polyphenylene ether resins, fluorine resins and ABS resins, and even more preferable are the epoxy resins and polyimide resins. In addition, the resin substrate may be made from either a single resin or from multiple resins. Furthermore, the resin may be coated onto another substrate material, or compound materials with multiple layers may be used. The resin substrates that can be used in the present invention are not limited to materials fabricated from resin, but may also be compound materials containing reinforcing materials such as fiberglass reinforcing material in the resin, or may include substrates wherein a coating is formed on a base material made of any of a variety of elements such as ceramic, glass, silicon, metal, or the like., Ceramics that can be used as the substrate material include, but are not limited to, alumina ($Al_2O_3$), steatite porcelain (MgO—$SiO_2$), forstellite (2MGO—$SiO_2$), mullite ($3Al_2O_3$—$2SiO_2$), magnesia (MgO), spinel (MgO—$Al_2O_3$), beryllia (BeO) and other oxide-type ceramics, along with aluminum nitride, silica carbide, and other non-oxide ceramics. In addition, glass ceramics and other low-temperature sintering ceramics may be used.

In the via filling method of the present invention, the plating temperature (solution temperature) can be set as convenient depending on the type of the plating solution, but is typically from 10 to 40° C. and preferably from 20 to 30° C. Plating temperatures that are too high may breakdown the grain refiner.

In the present method, any appropriate anode may be used, such choice depending on the type of metal being plated. Additionally, the anode may be either soluble or insoluble. For example, for copper plating, a phosphor-containing copper anode can be used as a soluble anode. Indium oxide, platinum-plated titanium, platinum, graphite, ferrite, titanium coated with tin dioxide and oxides of elements in the platinum family, stainless steel, and other materials can be used as insoluble anodes for copper plating.

It is desirable to bubble air or oxygen through the plating solution to increase the density of the dissolved oxygen in the present plating solution. While not intending to be bound by theory, it is thought that the dissolved oxygen in the plating solution functions as an oxidizer, reducing the amount of compounds having an —X—S— structure in the plating solution. A preferred way to increase the concentration of dissolved oxygen in the plating solution is to bubble air or oxygen through the plating solution, and it is not a problem if the bubbling agitates the plating solution. Such bubbling may be performed during the electrolytic plating process, or can be performed while the plating process is stopped.

In the present via filling process the metal plating solution is typically agitated. Such agitation is desirable in order to supply the metal ions and the additives uniformly to the surface to be plated. Air agitation or jet flow agitation can be used to agitate the metal plating solution. From the perspective of increasing the amount of oxygen dissolved in the plating solution, air agitation is preferable. Also, even when the agitation is performed using jet flow, air agitation can be used in combination. Furthermore, replacement filtering and circulatory filtering can also be performed, where circulatory filtering of the plating solution using a filtering device is especially preferred, because this causes the temperature of the plating solution to be uniform while removing contamination and sediment from the plating solution.

Via filling without voids is achieved using the via filling method of the present invention.

Although copper was used as the example in the explanations above, as mentioned earlier, the present invention applies to other metals, where, in those cases, any conventional plating solution can be used. The basic composition of such other metal electrolytic plating solutions are any conventional metal electrolytic plating solutions. The constituent elements of such basic compositions can be changed as appropriate, the concentrations can be modified, additives can be added, etc., by those skilled in the art as long as the object of the invention is achieved.

Although the present invention is explained in greater detail in the following examples, the examples are illustrative and they in noway limit the scope of the invention.

EXAMPLE 1

A substrate having 120 μm diameter vias with a depth of 60 μm was plated with copper as follows.

| Composition of Plating Solution | |
|---|---|
| $CuSO_4$-$5H_2O$: | 127.7 g/L |
| $H_2SO_4$: | 312.2 g/L |
| $Cl^-$ | 70 mg/L |
| SPS: | 7 mg/L |
| Non-ionic surfactant: | 250 mg/L |

Note: The SPS was a bis (3-sulfopropyl) disulfide disodium.

Jeffox WL-5000, which is an oxirane methyl-, polymer with oxirane, monobutyl ether manufactured by Texaco Chemical Company, was used as the non-ionic surfactant.

| PPR Electrolysis Conditions | | |
|---|---|---|
| A. | First Process | |
| | Current density: | 2A/dm² |
| | F/R ratio: | 1/3 |
| | Forward electrolysis interval: | 10 msec |
| | Reverse electrolysis interval: | 0.5 msec |
| | Temperature: | 20° C. |
| | Time: | 11 minutes |
| B. | Second Process | |
| | Current density: | 2A/dm² |
| | F/R ratio: | 1/0.5 |
| | Forward electrolysis interval: | 10 msec |
| | Reverse electrolysis interval: | 0.5 msec |
| | Temperature: | 20° C. |
| | Time: | 45 minutes |

FIGS. 1A to 1E are schematic diagrams showing cross-sections of the copper-filled vias on the plated substrate. As can be seen from these figures, none of the plated vias have voids.

EXAMPLE 2

A substrate having 120 μm diameter vias with a depth of 60 μm was plated with copper as follows. The experiment was performed using a plating solution with the same composition as in Example 1.

| Flash Plating | |
|---|---|
| Direct Current Electrolysis | |
| Current density: | 2A/dm² |
| Temperature: | 20° C. |
| Time: | 11 min |
| First Process | |
| Current density: | 2A/dm² |
| F/R ratio: | 1/3 |
| Forward electrolysis interval: | 10 msec |
| Reverse electrolysis interval: | 0.5 msec |

-continued

Flash Plating

| | |
|---|---|
| Temperature: | 20° C. |
| Time: | 45 minutes |

FIGS. 2A to 2E are schematic diagrams showing cross-sections of the copper-filled vias on the plated substrate. As can be seen from these figures, none of the plated vias have voids.

COMPARATIVE EXAMPLE 1

A substrate having 120 μm diameter vias with a depth of 60 μm was plated with copper as follows. The experiment was performed using a plating solution with the same composition as in Example 1.

| | |
|---|---|
| Current density: | 2 A/dm$^2$ |
| F/R ratio: | 1/0.5 |
| Forward electrolysis interval: | 10 msec |
| Reverse electrolysis interval: | 0.5 msec |
| Temperature: | 20° C. |
| Time: | 56 minutes |

FIGS. 3A to 3E are schematic diagrams showing cross-sections of the copper-filled vias on the plated substrate. As can be seen from these figures, 4 of 5 copper-filled vias have voids.

EXAMPLE 3

A substrate having 30 μm diameter vias with a depth of 40 μm was plated with copper as follows.

| | |
|---|---|
| Composition of Plating Solution: | |
| CuSO$_4$-5H$_2$O: | 250 g/L |
| H$_2$SO$_4$: | 150 g/L |
| Cl$^-$: | 60 mg/L |
| SPS: | 2 mg/L |
| Non-ionic surfactant: | 200 mg/L |
| PPR Electrolysis Conditions | |
| A. First Process | |
| Current density: | 0.5 A/dm$^2$ |
| F/R ratio: | 1/2 |
| Forward electrolysis interval: | 10 msec |
| Reverse electrolysis interval: | 0.5 msec |
| Temperature: | 20° C. |
| Time: | 90 minutes |

Figure 1A:
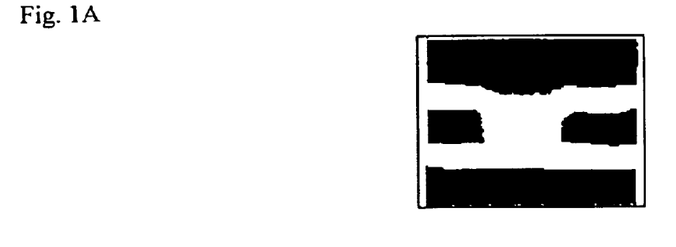
FIGS. 1A to 1E and 2A to 2E are schematic diagrams showing cross-sections of vias filled according to the invention.
Figure 1B:
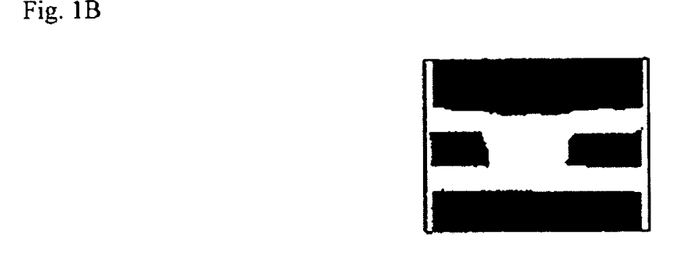
Figure 1C:
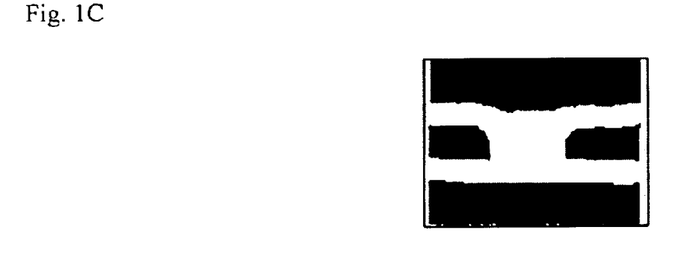
Figure 1D:
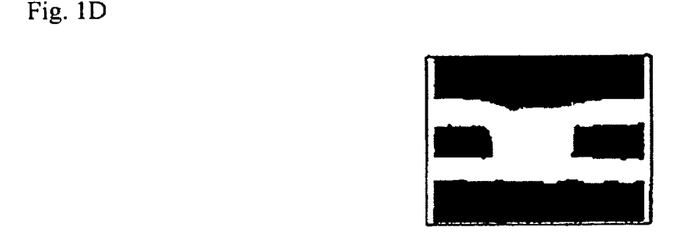
Figure 1E:
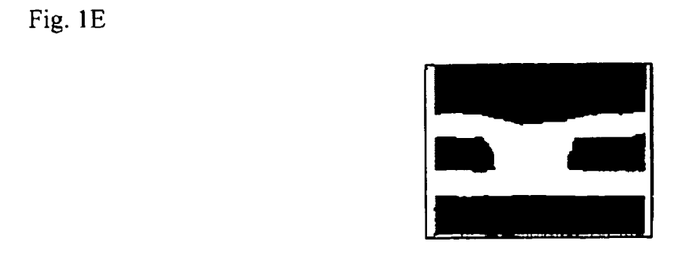
Figure 2A:
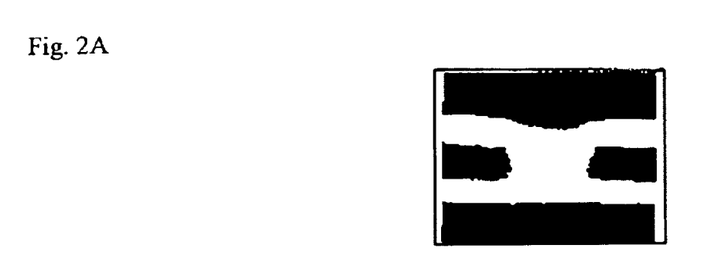
Figure 2B:
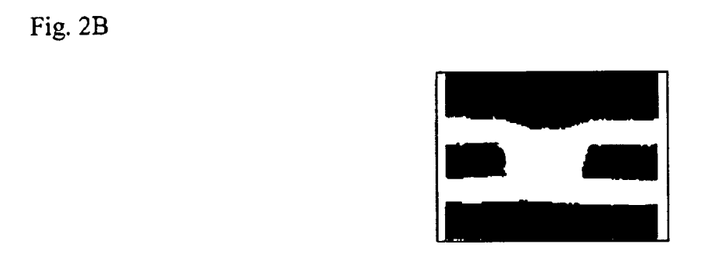
Figure 2C:
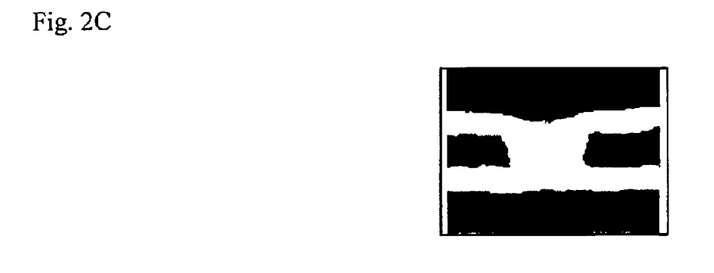
Figure 2D:
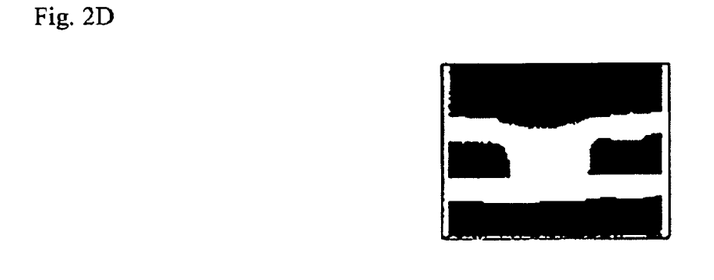
Figure 2E:
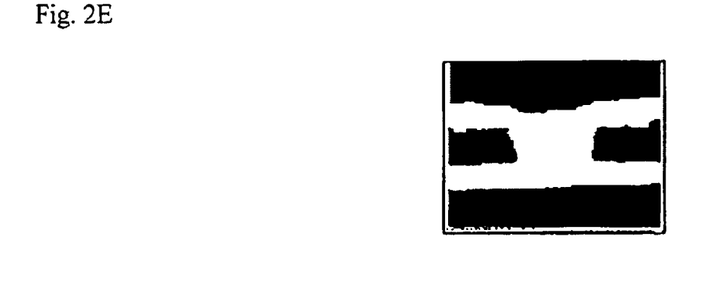
Figure 3A:
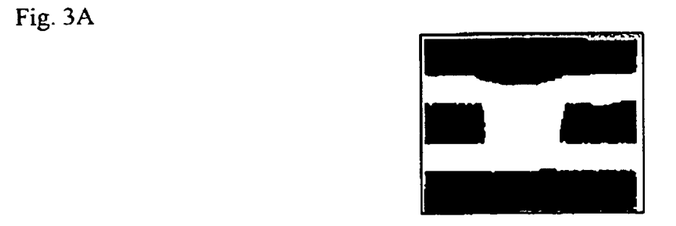
FIGS. 3A to 3E are schematic diagrams showing cross-sections of vias filled using a comparative process.
Figure 3B:
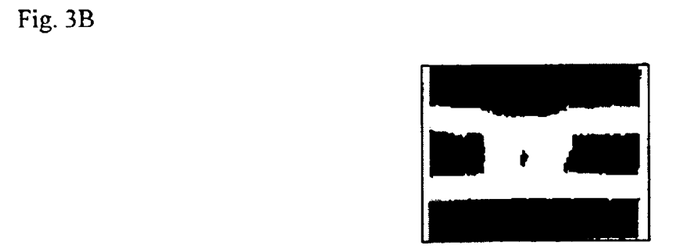
Figure 3C:
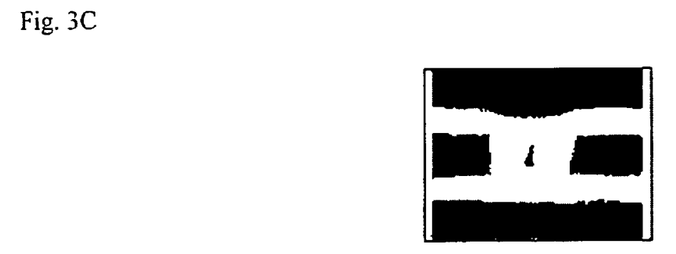
Figure 3D:
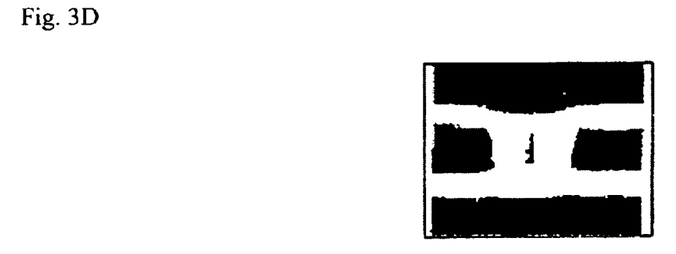
Figure 3E:
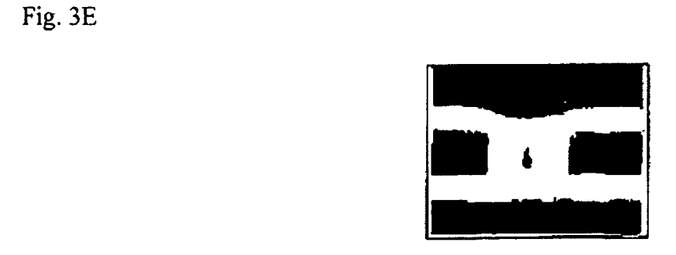
Figure 4:
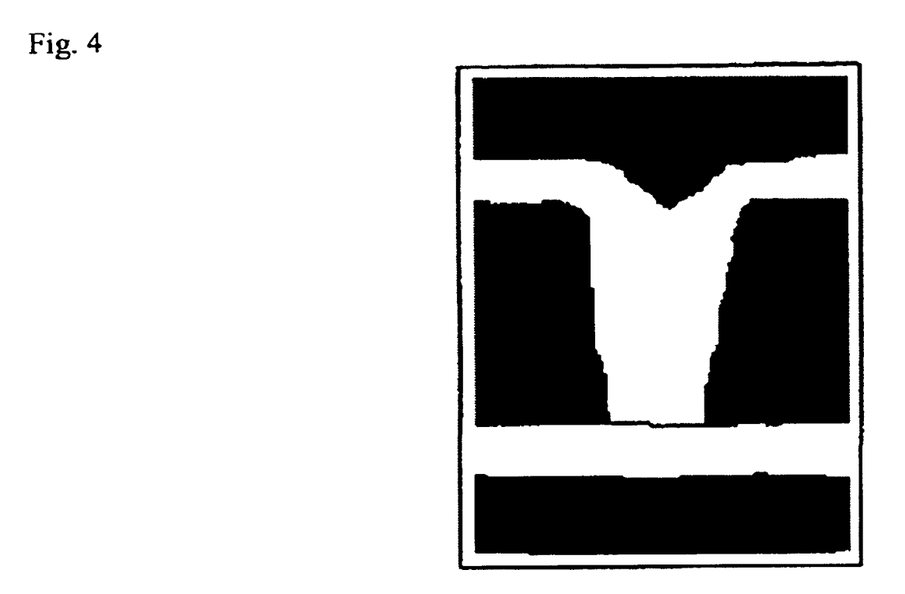
FIGS. 4 and 5 are schematic diagrams showing cross-sections of vias filled according to the invention.

FIG. 4 shows a schematic diagram showing a cross-section of a copper-filled via. As can be seen from the figure, the copper deposit is void-free.

EXAMPLE 4

Figure 5:
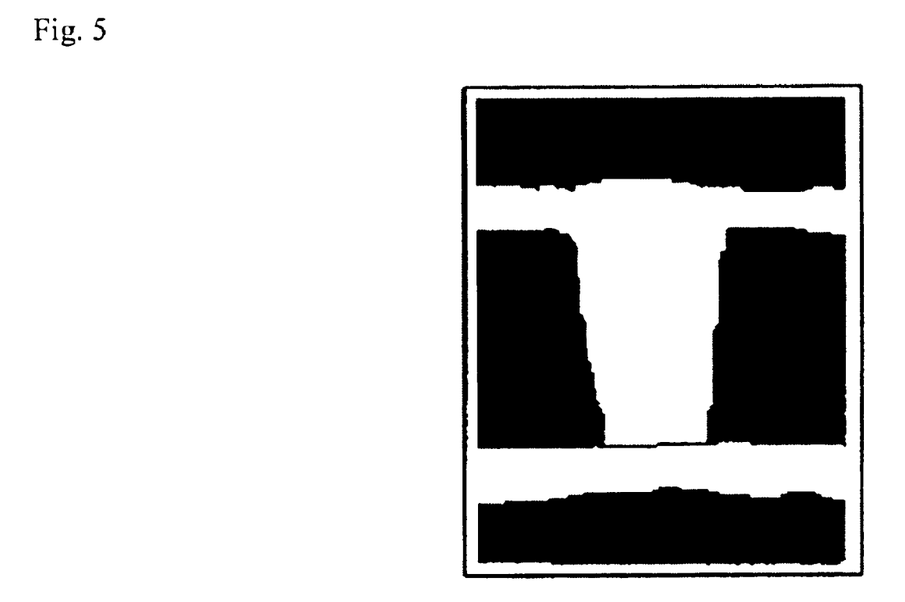

An experiment was performed under the same conditions as Example 3, except that a 1 msec pause interval was provided after the reverse electrolysis. The results are also shown in FIG. 5. As can be seen, a void-free copper deposit in the via was obtained.

What is claimed:

1. A method of filling vias on a substrate comprising contacting the substrate with a metal electroplating bath and applying sufficient current density to the metal electroplating bath to deposit a desired metal layer to fill the vias without voids, wherein the current density is applied in a first cycle comprising a forward current density (F) for 1 to 50 msec, a reverse current density (R) for 0.2 to 5 msec, and a rest interval, where a ratio of F/R is from 1/1 to 1/10 and a second cycle comprising a second forward current density (F2) for 1 to 50 msec and a second reverse current density (R2) for 0.2 to 5 msec where a ratio of F2/R2 for the second cycle is from 1/1 to 1/0.1.

2. The method of claim 1 wherein the metal electroplating bath is a copper electroplating bath.

3. The method of claim 2 wherein the copper electroplating bath comprises copper sulfate.

4. The method of claim 1 wherein the metal electroplating bath comprises a grain refiner.

5. The method of claim 1 wherein the rest interval is performed prior to applying the reverse current density or after applying the reverse current density.

6. The method of claim 1 wherein the substrate is a printed circuit board.

7. The method of claim 1 wherein the substrate is an integrated circuit substrate.

8. The method of claim 1 wherein the second cycle further comprises a second rest interval.

9. A method of filling vias on a substrate comprising contacting the substrate with a metal electroplating bath and applying sufficient current density to the metal electroplating bath to deposit a desired metal layer to fill the vias without voids, wherein the current density is applied in a first cycle comprising a first forward current density (F1) for 1 to 50 msec and a first reverse current density (R1) for 0.2 to 5 msec, where a ratio F1/R1 is from 1/1 to 1/10, and a second cycle comprising a second forward current density (F2) for 1 to 50 msec and a second reverse current density (R2) for 0.2 to 5 msec where a ratio of F2/R2 is from 1/1 to 1/0.1, where the second reverse current density is less than the first reverse current density.

* * * * *